United States Patent
Xie et al.

(10) Patent No.: US 11,023,171 B2
(45) Date of Patent: Jun. 1, 2021

(54) PERFORMING A REFRESH OPERATION BASED ON A WRITE TO READ TIME DIFFERENCE

(71) Applicant: Micron Technology, Inc., Boise, ID (US)

(72) Inventors: Tingjun Xie, Milpitas, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/514,820

(22) Filed: Jul. 17, 2019

(65) Prior Publication Data

US 2021/0019084 A1    Jan. 21, 2021

(51) Int. Cl.
*G06F 3/06* (2006.01)
*G11C 7/10* (2006.01)
*G11C 7/22* (2006.01)

(52) U.S. Cl.
CPC .......... *G06F 3/0659* (2013.01); *G06F 3/0611* (2013.01); *G06F 3/0653* (2013.01); *G06F 3/0673* (2013.01); *G11C 7/1051* (2013.01); *G11C 7/1096* (2013.01); *G11C 7/22* (2013.01)

(58) Field of Classification Search
CPC ... G06F 3/0611; G06F 3/0653; G06F 13/1636
USPC ........................................................ 711/106
See application file for complete search history.

(56) References Cited

U.S. PATENT DOCUMENTS

| | | | |
|---|---|---|---|
| 2011/0225465 A1* | 9/2011 | Blackmon | G06F 11/076 714/54 |
| 2012/0163097 A1 | 6/2012 | Ishikawa et al. | |
| 2015/0016203 A1* | 1/2015 | Sriramagiri | G11C 11/40611 365/222 |
| 2016/0070483 A1* | 3/2016 | Yoon | G06F 13/1694 711/154 |
| 2016/0071611 A1* | 3/2016 | Nurminen | G11C 13/0035 365/185.25 |
| 2016/0240240 A1* | 8/2016 | Kim | G11C 11/4099 |
| 2016/0372203 A1 | 12/2016 | Callaghan | |
| 2018/0174641 A1* | 6/2018 | Loh | G11C 11/40611 |
| 2018/0232173 A1 | 8/2018 | Chung et al. | |
| 2019/0237133 A1* | 8/2019 | Loh | G11C 11/40615 |
| 2020/0057579 A1* | 2/2020 | Mathews | G06F 3/0673 |

OTHER PUBLICATIONS

PCT International Search Report and Written Opinion for International Application No. PCT/US2020/042466, dated Oct. 21, 2020, 11 pages.

* cited by examiner

*Primary Examiner* — Than Nguyen
(74) *Attorney, Agent, or Firm* — Lowenstein Sandler LLP

(57) ABSTRACT

A read operation can be performed to retrieve data of a write unit at a memory sub-system. An indication of a time of the performance of the read operation can be received. Another indication of another time of a performance of a write operation to store the data of the write unit at the memory sub-system can be received. A difference between the time of the performance of the read operation and the another time of the performance of the write operation can be determined. A refresh operation can be performed for the data of the write unit at the memory sub-system based on the difference between the time of the performance of the read operation and the another time of the performance of the write operation.

20 Claims, 6 Drawing Sheets

PERFORMING A REFRESH OPERATION BASED ON A WRITE TO READ TIME DIFFERENCE

TECHNICAL FIELD

The present disclosure generally relates to a memory sub-system, and more specifically, relates to performing a refresh operation based on a write to read time difference at a memory sub-system.

BACKGROUND

A memory sub-system can be a storage system, a memory module, or a hybrid of a storage device and memory module. A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
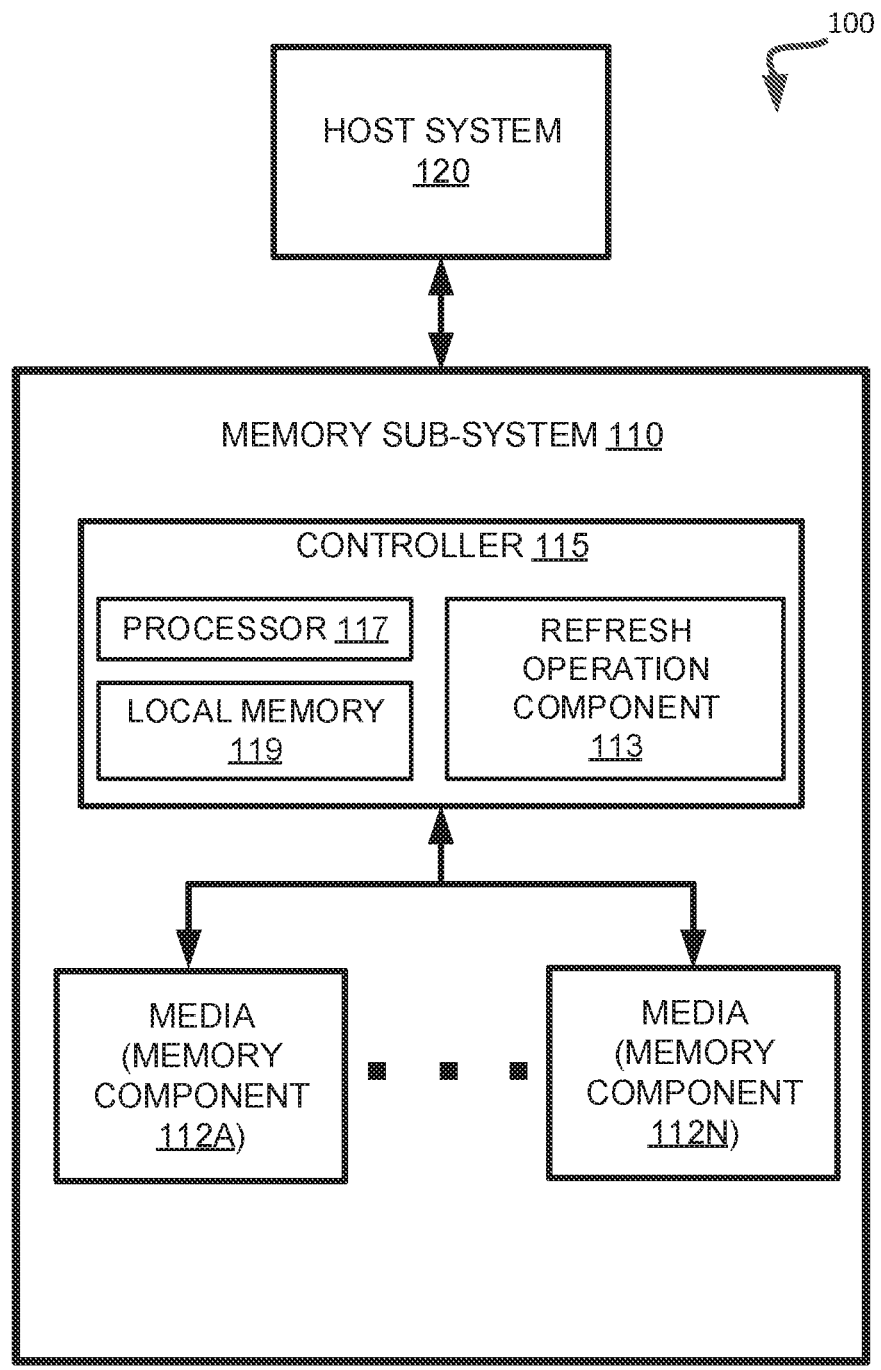
FIG. 1 illustrates an example computing environment that includes a memory sub-system in accordance with some embodiments of the present disclosure.

Aspects of the present disclosure are directed to performing a refresh operation based on a write to read time difference at a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A conventional memory sub-system can perform a read operation to retrieve data stored at memory components of the memory sub-system. For example, to perform the read operation, a read voltage can be applied to memory cells to determine whether the memory cell is in a high voltage state representing a bit value of '1' or a low voltage state representing a bit value of '0' (or vice versa). For certain types of memory components, a read operation can change the threshold voltage distribution of the memory cells, which is also known as a partial write effect. For example, in a read operation, any voltage state lower than and/or proximate to the applied read voltage can be changed or pushed away from the voltage point of the read voltage. Under certain circumstances, if the applied read voltage is inappropriate, the partial write effect induced by the read operation can deteriorate threshold voltage distribution of the memory cells. Such a phenomenon is referred to as read corruption. As a result of read corruption, the ensuing read operation at the same memory cells will have a higher bit error rate, which can decrease the performance of a memory sub-system as a result of more frequent error recovery operations being performed. Additionally, the likelihood of an unrecoverable data loss can be increased.

The threshold voltage distributions can vary after data has been programmed or written to the conventional memory sub-system. For example, at a particular voltage level, the impact of the read corruption can be larger if the read operation is performed soon after the data has been written as opposed to if the read operation is performed at a later time after the data has been written. As the amount of time that has elapsed since the data has been written continuously increases, the impact of the read corruption can continue to decrease. Thus, the read corruption of a particular read voltage can be different based on the time difference between when the data has been written and when the data is being read.

Aspects of the present disclosure address the above and other deficiencies by performing a refresh operation based on a write to read time difference. For example, when data is written to the memory sub-system, a timestamp or other indication of when the data has been written can be recorded. Subsequently, a read operation can be performed to retrieve the data. As a result of the read operation, the indication of when the data has been written can be retrieved and compared with a time of when the read operation was performed. If the difference between when the data was written and when the data was read satisfies a threshold time difference (e.g., the read operation was performed within a specified time period soon after the data was written), then a refresh operation can be performed at the memory cells that stored the data to re-write the data. Otherwise, if the difference between when the data was written and when the data was read does not satisfy the threshold time difference (e.g., is not within the specified time period), then the refresh operation is not performed for the data that has been read as the read operation likely did not cause significant read corruption to memory cells that store the data.

Advantages of the present disclosure include, but are not limited to, a decrease in the error rate of the memory sub-system. For example, the refresh operation can be performed to re-write data when the impact of read corruption from a read operation can significantly change the threshold voltage distributions of the memory cells included in the memory sub-system. Additionally, the performance of the memory sub-system can be improved as fewer error correction operations can be performed since the data stored at the memory sub-system is less likely to be read with errors due to the reduced impact of read corruption. For example, since fewer read retry operations or other error correction operations are performed, an increased number of read operations and write operations can be performed by the memory sub-system.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a refresh operation component 113 that can be used to perform refresh operations for data stored at the memory sub-system 110. In some embodiments, the controller 115 includes at least a portion of the refresh operation component 113. For example, the controller 115 can include a processor 117 (processing device) configured to execute instructions stored in local memory 119 for performing the operations described herein. In some embodiments, the refresh operation component 113 is part of the host system 120, an application, or an operating system. In the same or alternative embodiments, portions of the refresh operation component 113 are part of the host system 120 while other portions of the refresh operation component 113 are performed at the controller 115.

The refresh operation component 113 can be used to perform refresh operations at write units of the memory sub-system. A write unit can include one or more memory cells (i.e., a group of memory cells). Data can be stored at the write unit as part of a write operation and can be retrieved as part of a read operation. A refresh operation can be performed for the data based on a difference between when the data was written to the memory sub-system and when the read operation has been performed to retrieve the data. Further details with regards to the operations of the refresh operation component 113 are described below.

Figure 2:
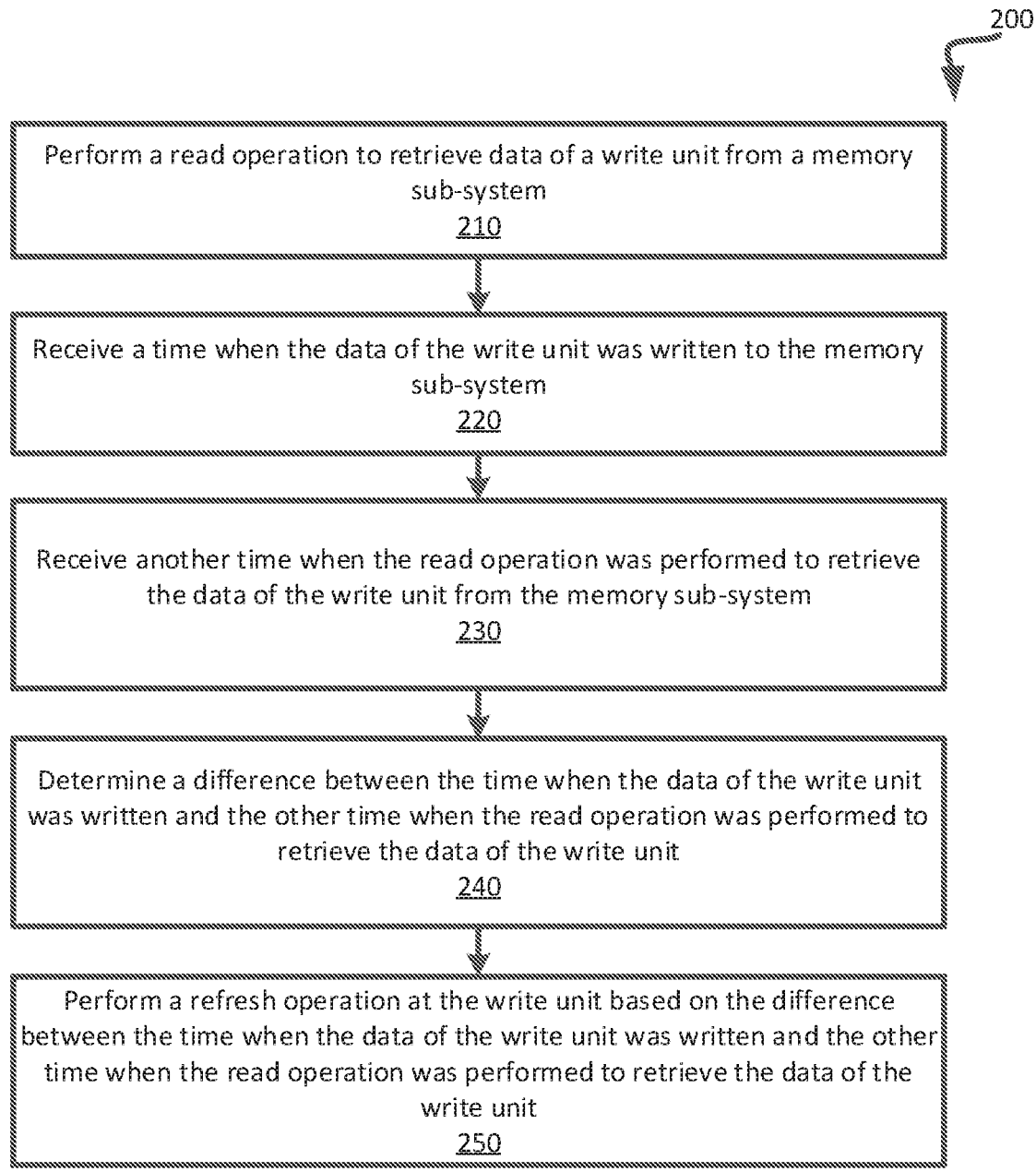
FIG. 2 is a flow diagram of an example method to perform a refresh operation based on a write to read time difference in accordance with some embodiments.

FIG. 2 is a flow diagram of an example method 200 to perform a refresh operation based on a write to read time difference in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic performs a read operation to retrieve data of a write unit from a memory sub-system. As previously mentioned, a read voltage can be applied to the write unit when performing the read operation. The write unit can be a group of memory cells or data blocks of the memory sub-system that store data. In some embodiments, the write unit can include host data that can be data received from a host system to be stored at the write unit. The write unit can further include a timestamp or any value indicative of when the data was stored at the write unit. For example, the timestamp can identify the time when a write operation was performed to store the host data at the write unit. In some embodiments, the write unit can include other data such as system metadata and error correction parity bits. Further details with respect to the portions of the write unit are described with respect to FIG. 4. The host data can be returned to the host system that has requested the read operation. At operation 220, the processing logic receives a time when the data of the write unit was written to the memory sub-system. For example, as previously described, the time when the data was written as part of a write operation can be received from a timestamp or other such time value that is included with the write unit. In some embodiments, the time when the data of the write unit was written can be stored in a separate data structure. For example, the time can be stored at a controller or memory location (i.e., volatile memory or non-volatile memory) that is separate from the write unit.

At operation 230, the processing logic receives another time when the read operation was performed to retrieve the data of the write unit from the memory sub-system. For example, the time or any other value indicative of the time when the read operation to retrieve the data from the write unit was performed can be received. At operation 240, the processing logic determines a difference between the time when the data was written to the write unit and the other time when the read operation was performed to retrieve the data of the write unit. For example, an amount of time that has elapsed since the time the data was written until the time that the data is read can be determined. In some embodiments, the time when the data was written can be a combination of when the data was written and a minimum time requirement of the memory sub-system before any read operation can be performed after the performance of a write operation. The difference between the time of the performance of the write operation and the time of the performance of the read operation can indicate whether the read operation has been performed in a specified time period that can result in an increased read corruption as further described in conjunction with FIG. 3.

As shown in FIG. 2, at operation 250, the processing logic performs a refresh operation at the write unit based on the difference between the time when the data of the write unit was written and the other time when the read operation was performed to retrieve the data of the write unit. For example, the refresh operation can be performed based on whether the difference satisfies a threshold condition. In some embodiments, the threshold condition can be satisfied when the difference between the time when the data was written and the time when the same data was read is less than a threshold difference. In the same or alternative embodiments, the threshold condition is not satisfied when the difference is equal to or exceeds the threshold difference. As further described below, the refresh operation can be performed if the read operation is performed within a specified time period (i.e., a hazard zone) after the data was written. If the read operation is performed within the specified time period, then the read corruption of the read operation likely significantly impacts the threshold voltage distribution of memory cells included in the write unit.

The refresh operation can be a re-writing of the data stored at the memory cells of the write unit. For example, the refresh operation can be, but is not limited to, a write operation that is performed to re-write data at the memory cells of the write unit. For example, bit values stored at a memory cell can be programmed again at the memory cell when the refresh operation is performed for the memory cell.

In some embodiments, the refresh operation can be multiple consecutive write operations that are each performed to re-write the same data at the memory cells of the write unit. In some embodiments, the refresh operation is consecutive write operations that are to write alternating states at the memory cells. For example, for a bit value of '0', the refresh operation can be an initial write operation to program the memory cell to a value of '1' and then a subsequent write operation to restore the memory cell to the value of '0.' Thus, consecutive write operations can be performed to write alternating states or values at the memory cell. The consecutive write operations can be an even number of write operations.

Figure 3:
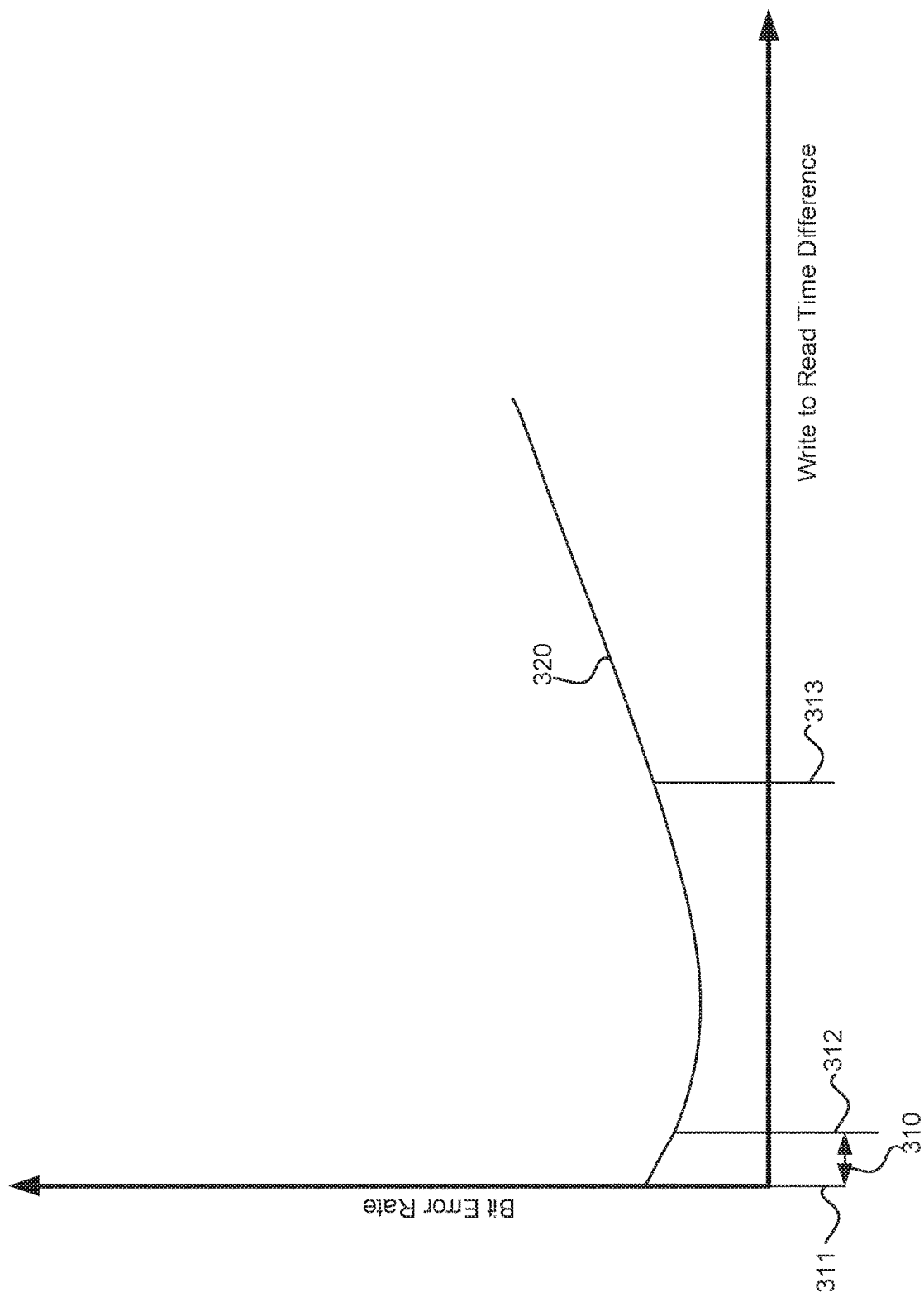
FIG. 3 illustrates bit error rates relative to write to read time differences in accordance with some embodiments of the present disclosure.

FIG. 3 illustrates bit error rates relative to write to read time differences in accordance with some embodiments of the present disclosure. In some embodiments, the refresh operation component 113 of FIG. 1 can perform a refresh operation based on the write to read time difference.

As shown in FIG. 3, the bit error rate for a particular read voltage is shown by the curve 320. The bit error rates for the same read voltage are illustrated as the write to read time difference for a write unit changes. For example, initially at the earlier portion of the write to read time difference, the bit error rate can be high (e.g., at point 311) and the bit error rate can decrease as the write to read time difference increases to point 312. After point 312, the bit error rate can further decrease then later increase again as the write to read time difference increases as more time elapses since data has been written to a write unit. In some embodiments, the point 312 can be at the write to read time difference that corresponds to the lowest bit error rate for the curve 320 (e.g., the point 312 is the bottom point of curve 320). The specified time period 310 that is bound by points 311 and 312 can be a 'hazard zone' where the application of a read voltage can cause significant read corruption that can shift or change the threshold voltage distribution at memory cells of the write unit. Thus, if a read operation is performed at a time during the specified time period 310, then the refresh operation can be performed to re-write the data at the write unit. Otherwise, the refresh operation is not performed if the read operation is performed after the specified time period.

In some embodiments, different read voltages can be used. For example, as shown, after the write to read time difference increases, the bit error rate can become larger as shown at point 313. At this point, the memory sub-system can utilize a different read voltage than the read voltage that is represented by the curve 320. For example, a higher read voltage can be used to perform read operations. For the new read voltage, the specified time period can be different than the specified time period 310 of the prior read voltage that is represented by the curve 320.

Figure 4:
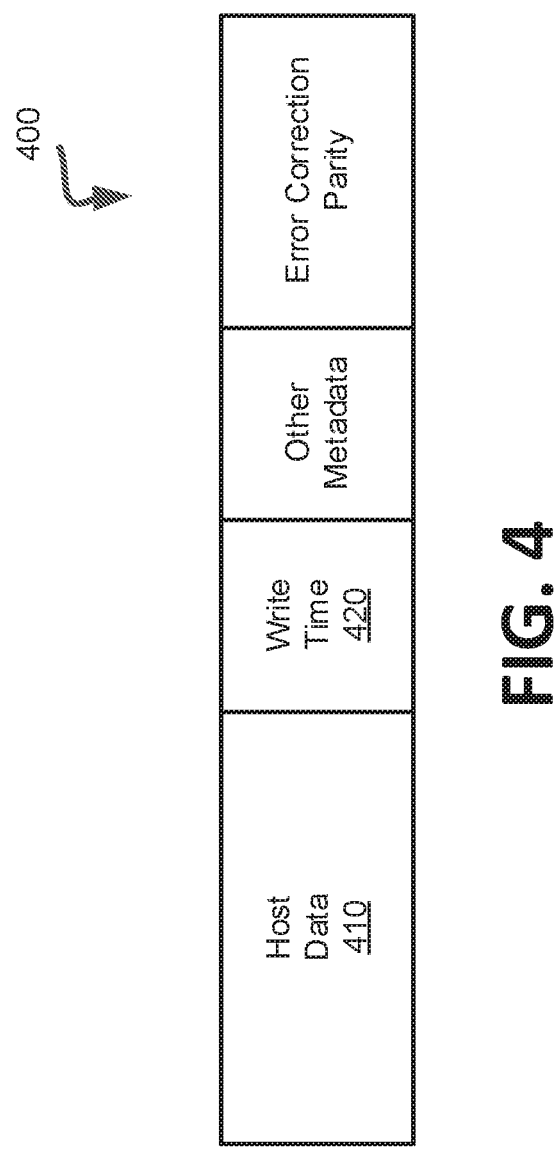
FIG. 4 illustrates a write unit in accordance with some embodiments of the present disclosure.

FIG. 4 illustrates a write unit 400 in accordance with some embodiments of the present disclosure. In some embodiments, the refresh operation component 113 of FIG. 1 can store data of the write unit.

As shown in FIG. 4, the write unit 400 can include host data 410 that is received from a host system and that is programmed to the write unit 400. For example, a write operation is performed to store the host data 410 at the write unit 400. A timestamp or other such value indicative of time can be generated when the write operation was performed. The timestamp can be stored as the write time 420 with the write host data 410. Furthermore, the write unit 400 can include other metadata such as characteristics of the memory sub-system when the write operation was performed (e.g., operating temperature or other such information) as well as error correction parity bits that are used for error correction operations when performing a read operation for the host data 410.

Although the write unit 400 illustrates the write time 420 being included in the write unit 400, in some embodiments the write time 420 is not stored within the write unit 400. For example, in some embodiments, the write time 420 can be stored in a separate data structure that includes a record of the write time for each write unit of the memory sub-system. The data structure can be stored in a separate memory of a controller of the memory sub-system.

Figure 5:
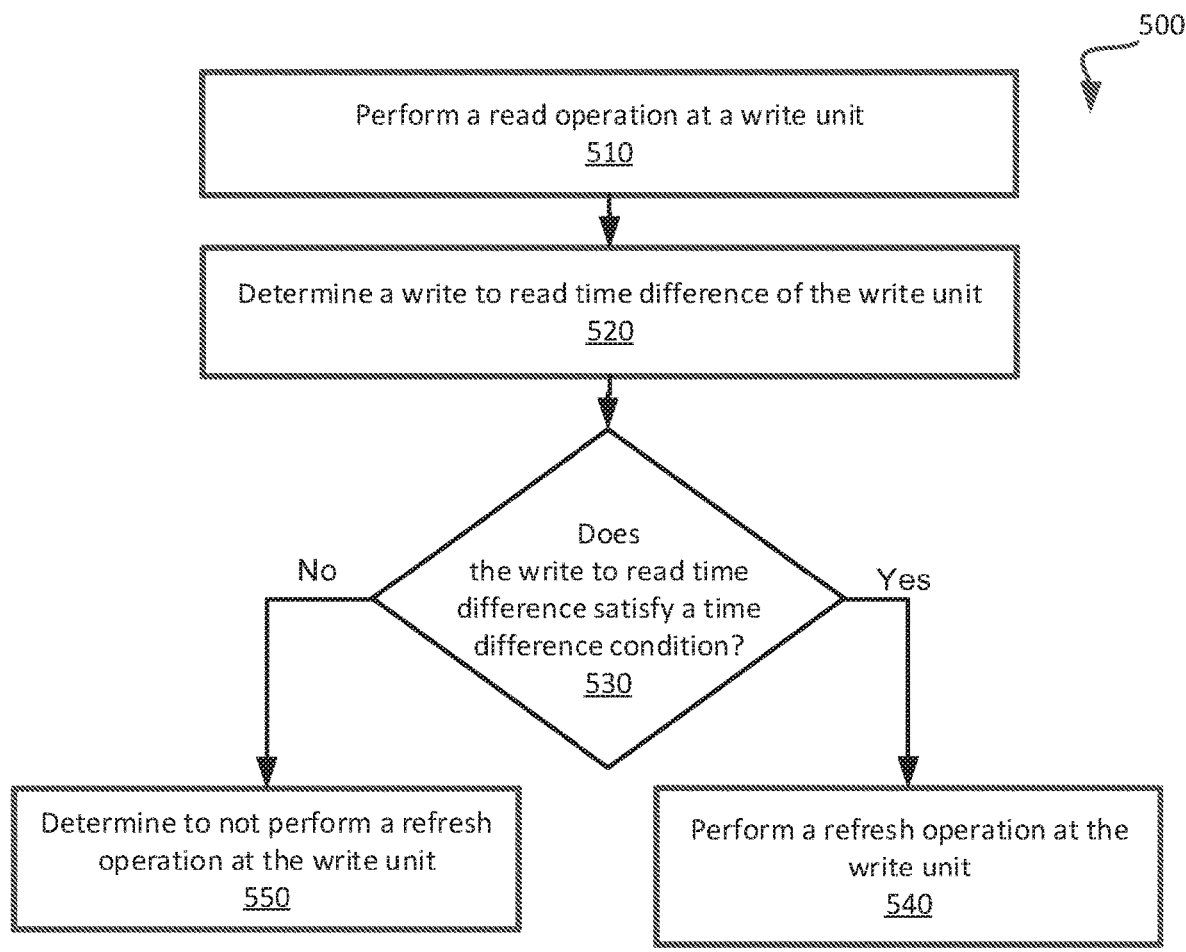
FIG. 5 is a flow diagram of an example method to perform a refresh operation in accordance with some embodiments.

FIG. 5 is a flow diagram of an example method to perform a refresh operation in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, the processing logic performs a read operation at a write unit. For example, a host system can provide a request for the read operation for data that has been previously written to the write unit. At operation 520, the processing logic determines a write to read time difference of the write unit. For example, an amount of time that has elapsed since a write operation was performed for the write unit until the read operation was performed at the write unit can be determined. At operation 530, the processing logic determines whether the write to read time difference satisfies a time difference condition. For example, a determination can be made as to whether the write to read time difference indicates that the read operation is within a specified time period after the write operation was performed. The specified time period can be a portion of time after the write operation is performed where a read operation can result in read corruption that changes the threshold voltage distribution of the memory cells of the write unit. In some embodiments, the write to read time difference satisfies the time difference condition when the read operation is performed at or within a specified time period. Otherwise, the write to read time difference does not satisfy the time difference condition when the read operation is not performed at or within the specified time period. For example, the write to read time difference is not satisfied when the read operation is performed after the end of the specified time period. In some embodiments, the time difference condition (i.e., the specified time period) can change based on operating characteristics of the memory sub-system. For example, the specified time period can change (e.g., become longer or shorter or have a different start and/or end time) based on the operating characteristic of the memory sub-system. In some embodiments, the operating characteristic can be a temperature of the memory sub-system, an error condition of the memory sub-system, a particular read voltage that is being used, the number of operations (i.e., write operations) that have been performed at the memory sub-system or particular cells of the memory sub-system (e.g., wear leveling), etc.

In response to determining that the write to read time difference satisfies the time difference condition, at operation 540, the processing logic performs a refresh operation at the write unit. For example, the data of the write unit can be re-written. In some embodiments, the data of the write unit is written to the same memory cells that store the data. In the same or alternative embodiments, the data of the write unit is written to a different group of memory cells. In some embodiments, the refresh operation is performed when the write to read time difference satisfies the time difference condition (e.g., the read operation is performed within the specified time period) and the performed read operation resulted in at least one bit error in the retrieved data. For example, the refresh operation can be performed when the write to read time difference satisfies the time difference condition and the decoding portion of an error control operation for the retrieved data resulted in at least one bit error or at least a threshold number of bit errors. Otherwise, in some embodiments, if the write to read time difference satisfies the time difference condition and no bit errors or less than the threshold number of bit errors were identified for the retrieved data, then the refresh operation is not performed.

Referring to FIG. 5, in response to determining that the write to read time difference does not satisfy the time difference condition, at operation 550, the processing logic determines to not perform a refresh operation at the write unit. For example, the data at the write unit is not re-written.

Figure 6:
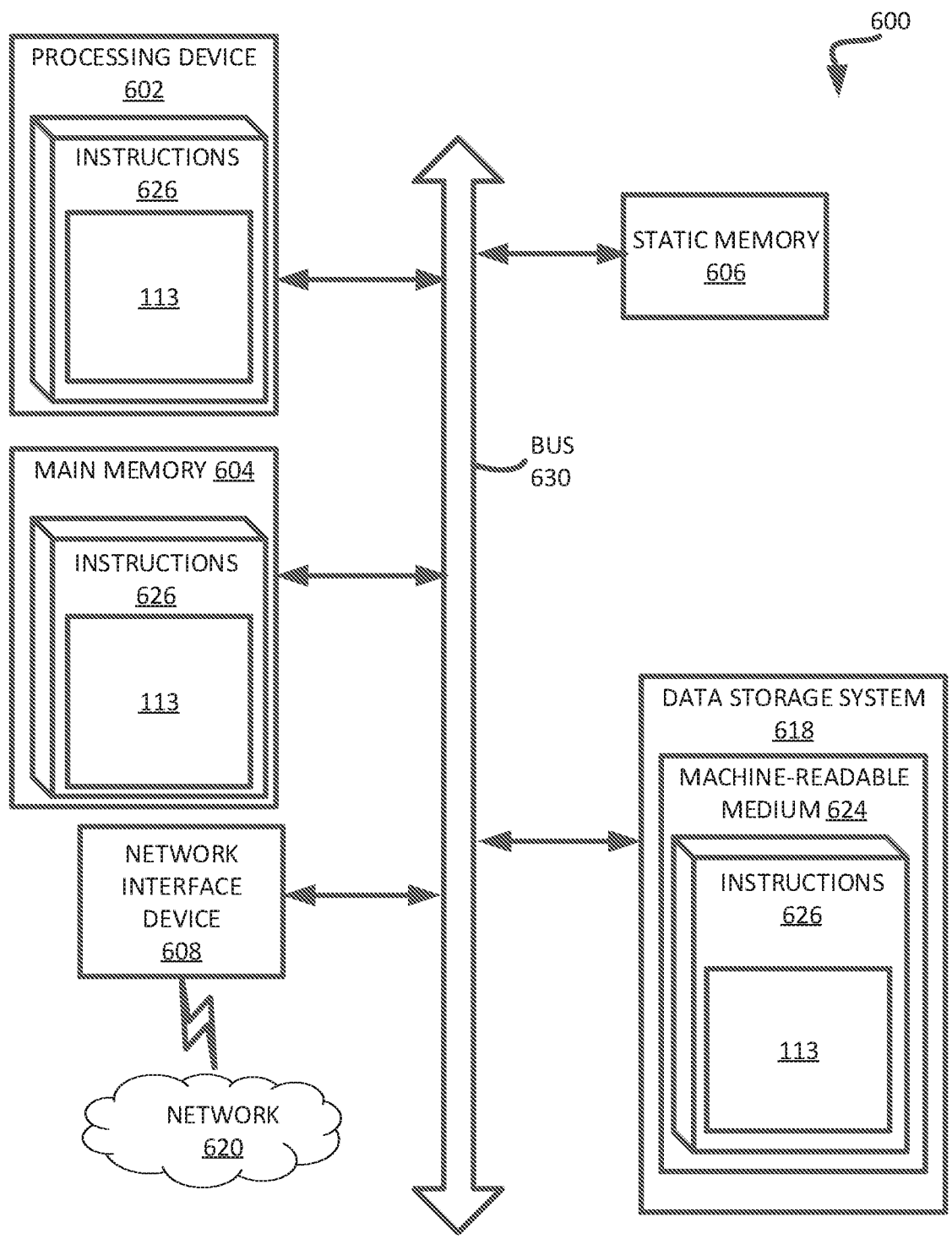
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a refresh operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a refresh operation component (e.g., the refresh operation component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    performing a read operation to retrieve data of a write unit at a memory sub-system;
    receiving an indication of a time of the performance of the read operation;
    receiving another indication of another time of a performance of a write operation that stored the data of the write unit at the memory sub-system;
    determining a difference between the time of the performance of the read operation and the another time of the performance of the write operation; and
    performing, by a processing device, a refresh operation for the data of the write unit at the memory sub-system based on the difference between the time of the performance of the read operation and the another time of the performance of the write operation.

2. The method of claim 1, further comprising:
    determining whether the difference between the time of the performance of the read operation and the another time of the performance of the write operation satisfies a threshold difference, wherein the refresh operation is performed responsive to the difference satisfying the threshold difference.

3. The method of claim 2, wherein the threshold difference corresponds to an amount of time that has elapsed since the performance of the write operation that stored the data of the write unit at the memory sub-system.

4. The method of claim 1, wherein receiving the another indication of the another time of the performance of the write operation comprises:
    identifying a time value that is included in the write unit, the time value corresponding to the indication of the another time of the performance of the write operation.

5. The method of claim 1, wherein the difference between the time of the performance of the read operation and the another time of the performance of the write operation is associated with a read corruption of the read operation.

6. The method of claim 1, wherein the refresh operation corresponds to a re-writing of the data of the write unit.

7. The method of claim 1, wherein the refresh operation corresponds to a plurality of write operations that are performed to re-write the data of the write unit.

8. A non-transitory computer readable medium comprising instructions, which when executed by a processing device, cause the processing device to perform operations comprising:
    performing a read operation to retrieve data of a write unit at a memory sub-system;
    receiving an indication of a time of the performance of the read operation;
    receiving another indication of another time of a performance of a write operation to store the data of the write unit at the memory sub-system;
    determining a difference between the time of the performance of the read operation and the another time of the performance of the write operation; and
    performing a refresh operation for the data of the write unit at the memory sub-system based on the difference between the time of the performance of the read operation and the another time of the performance of the write operation.

9. The non-transitory computer readable medium of claim 8, the operations further comprising:
    determining whether the difference between the time of the performance of the read operation and the another time of the performance of the write operation satisfies a threshold difference, wherein the refresh operation is performed responsive to the difference satisfying the threshold difference.

10. The non-transitory computer readable medium of claim 9, wherein the threshold difference corresponds to an amount of time that has elapsed since the performance of the write operation that stored the data of the write unit at the memory sub-system.

11. The non-transitory computer readable medium of claim 8, wherein to receive the another indication of the another time of the performance of the write operation, the operations further comprise:

identifying a time value that is included in the write unit, the time value corresponding to the indication of the another time of the performance of the write operation.

12. The non-transitory computer readable medium of claim 8, wherein the difference between the time of the performance of the read operation and the another time of the performance of the write operation is associated with a read corruption of the read operation.

13. The non-transitory computer readable medium of claim 8, wherein the refresh operation corresponds to a re-writing of the data of the write unit.

14. The non-transitory computer readable medium of claim 8, wherein the refresh operation corresponds to a plurality of write operations that are performed to re-write the data of the write unit.

15. A system comprising:
a memory component; and
a processing device, operatively coupled with the memory component, to:
perform a read operation to retrieve data at the memory component;
determine a time of the performance of the read operation;
determine whether the time of the performance of the read operation satisfies a threshold time period since a performance of a write operation that stored the data at the memory component; and
perform another write operation to re-write the data at the memory component in response to determining that the time of the performance of the read operation satisfies the threshold time period.

16. The system of claim 15, wherein the processing device is further to:
in response to determining that the time of the performance of the read operation does not satisfy the threshold time period, determine to not perform the another write operation to re-write the data at the memory component.

17. The system of claim 15, wherein the threshold time period corresponds to an amount of time that has elapsed since the performance of the write operation that stored the data at the memory component.

18. The system of claim 15, wherein the processing device is further to:
identify a time value that is included with the data at the memory component, the time value corresponding to an indication of when the performance of the write operation occurred.

19. The system of claim 15, wherein the threshold time period is associated with a read corruption that is caused by the read operation.

20. The system of claim 15, wherein the processing device is further to:
perform an additional write operation to re-write the data at the memory component subsequent to the another write operation.

* * * * *